(12) United States Patent
Hikida

(10) Patent No.: US 8,241,985 B2
(45) Date of Patent: Aug. 14, 2012

(54) SEMICONDUCTOR DEVICE HAVING GATE ELECTRODE WITH LOWER IMPURITY CONCENTRATION AT EDGE PORTIONS THAN ABOVE CHANNEL AND METHOD OF MANUFACTURING THE SAME

(75) Inventor: Satoshi Hikida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 224 days.

(21) Appl. No.: 12/659,514

(22) Filed: Mar. 11, 2010

(65) Prior Publication Data

US 2010/0230748 A1 Sep. 16, 2010

(30) Foreign Application Priority Data

Mar. 12, 2009 (JP) ................. 2009-060149

(51) Int. Cl.
*H01L 21/336* (2006.01)

(52) U.S. Cl. .. 438/289; 438/304; 438/307; 257/E21.196

(58) Field of Classification Search .......... 257/340, 257/364, 404, E21.196, E29.134
See application file for complete search history.

(56) References Cited

U.S. PATENT DOCUMENTS

| | | | |
|---|---|---|---|
| 5,418,392 | A | 5/1995 | Tanabe |
| 6,091,118 | A * | 7/2000 | Duane ........................ 257/386 |
| 6,200,839 | B1 * | 3/2001 | Batra et al. .................. 438/180 |
| 2005/0116285 | A1 | 6/2005 | Nishibe et al. |

FOREIGN PATENT DOCUMENTS

| | | |
|---|---|---|
| CN | 1606172 | 4/2005 |
| CN | 101043007 | 9/2007 |
| JP | 04-096275 | 3/1992 |
| JP | 6-275821 | 9/1994 |
| JP | 06-349853 | 12/1994 |
| JP | 10-004189 | 1/1998 |
| JP | 2004-047721 | 2/2004 |
| JP | 2004-281843 | 10/2004 |
| JP | 2005-116891 | 4/2005 |

* cited by examiner

*Primary Examiner* — Stephen W Smoot

(74) *Attorney, Agent, or Firm* — Harness, Dickey & Pierce, P.L.C.

(57) ABSTRACT

A high breakdown voltage MOS transistor capable of reducing a leakage current while reducing an element size as compared with conventional ones is realized. On a P type well, with a channel area ch in between, an N type first impurity diffusion area including a drain area and drain side drift area, and an N type second impurity diffusion area including a source area and a source side drift area are formed. Moreover, a gate electrode is formed, via a gate oxide film, above a part of the first impurity diffusion area, above the channel area and above a part of the second impurity diffusion area. The gate electrode is doped with an N type, and an impurity concentration of portions located above the first and the second impurity diffusion areas is lower than an impurity concentration of a portion located above the channel area.

2 Claims, 8 Drawing Sheets

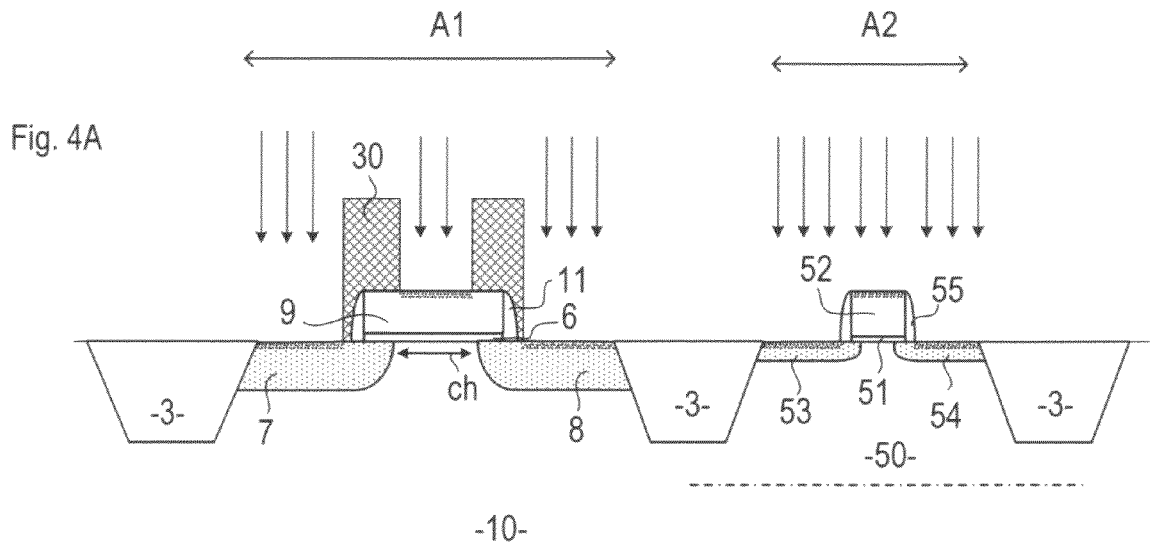
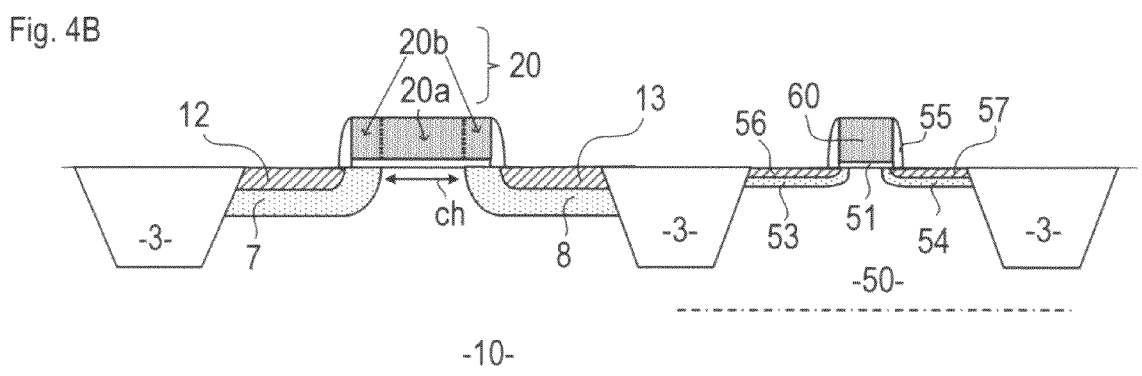
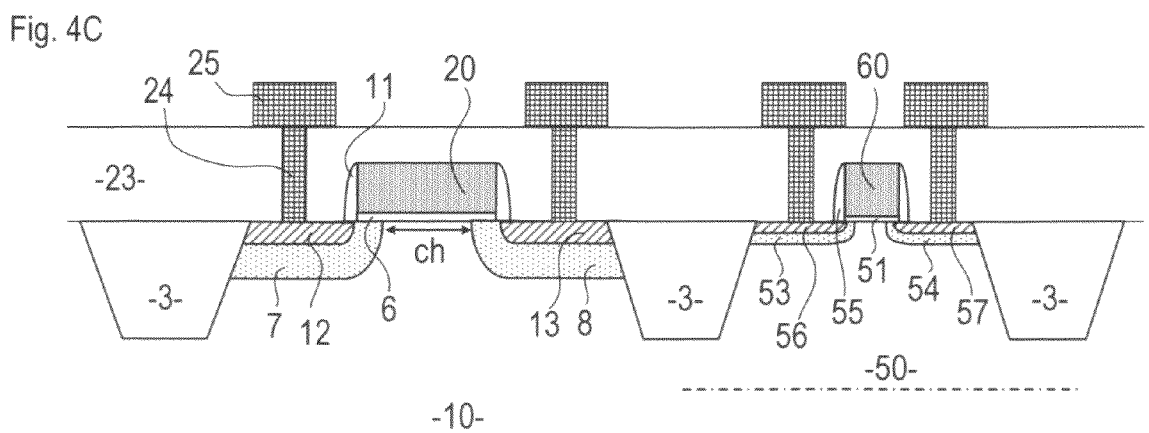

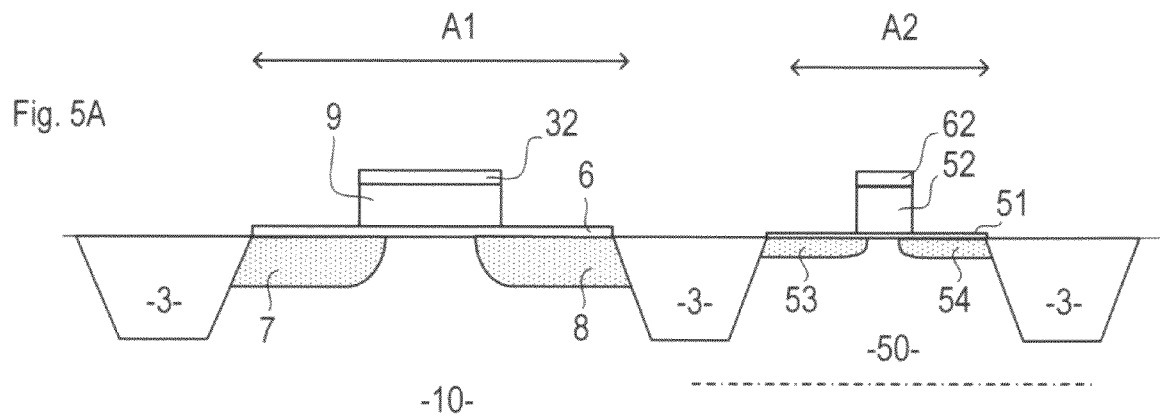
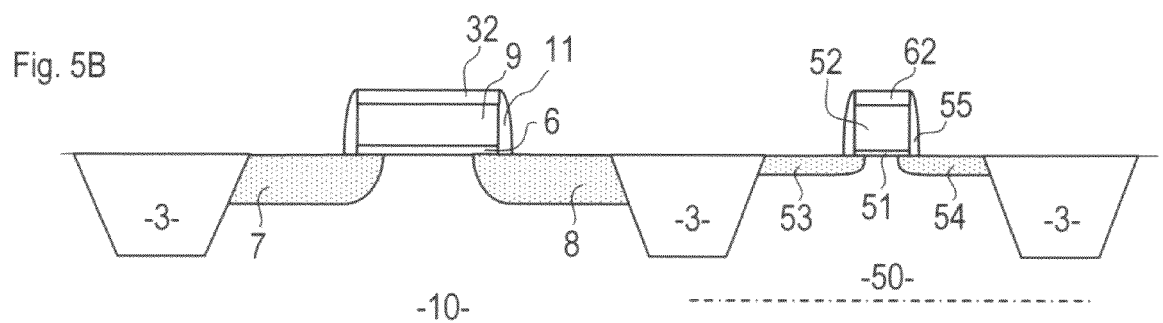
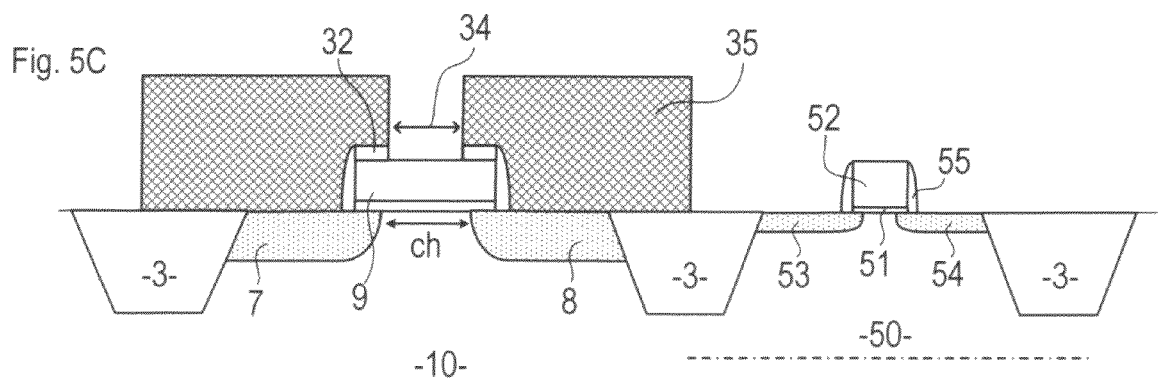

SEMICONDUCTOR DEVICE HAVING GATE ELECTRODE WITH LOWER IMPURITY CONCENTRATION AT EDGE PORTIONS THAN ABOVE CHANNEL AND METHOD OF MANUFACTURING THE SAME

CROSS REFERENCE TO RELATED APPLICATION

This Nonprovisional application claims priority under 35 U.S.C. §119(a) on Patent Application No. 2009-060149 filed in Japan on 12 Mar. 2009 the entire contents of which are hereby incorporated by reference.

BACKGROUND OF THE INVENTION

1. Field of the Invention

The present invention relates to a semiconductor device and a method of manufacturing the same, and specifically relates to a technique for enhancing a high breakdown voltage of a MOS transistor.

2. Description of the Related Art

As a semiconductor device is given a higher power and a higher performance, a number of elements such as transistors arranged on a semiconductor device is dramatically increasing in the recent years, and reduction and fining in size are being required. This does not leave a transistor in which a high breakdown voltage is required, such as a liquid crystal driver, an exception thereof.

In reducing the size of the transistor, a gate oxide film has been thinned so that a so-called short channel effect does not occur. However, by thinning the gate oxide film, an electric field (gate electric field) concentrates at a portion where a gate electrode and a drain overlap, and, due to this high electric field, a problem of an increase of leakage current (GIDL: Gate Induced Drain Leakage) caused by electrons tunneling from a valence band to a conductive band is being manifested.

As a method for solving the aforesaid problem, conventionally, a technique to lower the electric field of edge portions of the gate electrode by making a thickness of the gate oxide film located below the edge portions of the gate electrode thicker than that above a channel area has been employed (offset LOCOS). However, in this method, a configuration thereof has the edge portions of the gate electrode arranged above a LOCOS oxide film that is thicker than the gate oxide film, and as such, the element as a whole requires a very large occupying space.

To solve the problem above, a technique described in Japanese patent application publication No. 2004-47721 (hereinafter referred to as 'document 1') has been proposed. In this technique, as shown in FIG. 8, an offset area w1 is provided to separate a high concentration drain area 73 and a silicide 81 from a gate electrode 76 in a MOS transistor, to alleviate the electric field between the drain area 73 and a drain side edge portion of the gate electrode 76, to thereby realize a reduction in the leakage current and an enhancement of the breakdown voltage.

Note that in FIG. 8, 71 indicates an element separating insulation film, 72 indicates a drift area, 73 indicates the drain area, 74 indicates a source area, 75 indicates the gate oxide film, 76 indicates the gate electrode, 77, 78 indicate insulation films and 81 to 83 indicate silicide areas.

However, even in the technique of the document 1, the offset area w1 needs to be secured, and as such, a size enlargement in accordance with said offset is inevitable; and this hinders the size reduction of the transistor.

SUMMARY OF THE INVENTION

In view of the above problems, an object of the present invention is to realize a high breakdown voltage MOS transistor capable of realizing the reduction of the leakage current while reducing the element size as compared with conventional ones.

In order to achieve the above object, according to a first feature of the present invention, there is provided a semiconductor device including:

a well of a first conductivity type formed on a substrate;

a first impurity diffusion area and a second impurity diffusion area formed on the well, separated from each other by a channel area and of a second conductivity type different from the first conductivity type; and a gate electrode formed, via a gate oxide film, above a part of the first impurity diffusion area, above the channel area and above a part of the second impurity diffusion area, wherein the gate electrode is doped with the second impurity type, and an impurity concentration of electrode edge portions located above the first and second impurity diffusion areas is lower than an impurity concentration of a portion located above the channel area.

According to the above feature of the present invention, in the gate electrode, compared with the portion located above the channel area, the impurity concentration of the electrode edge portions is lowered. Accordingly, with respect to the gate electrode, while suppressing a depletion at the location above the channel area influencing the electric characteristic of the transistor, the depletion at the electrode edge portions can solely be enhanced.

Consequently, apparently the same effect as thickening the gate oxide film only at an area of the edge portions of the gate electrode can be achieved, and the concentration of the electric field in said area can be alleviated.

Further, according to this configuration, the gate oxide film does not actually need to be thickened, so that the element size can be reduced compared with the conventional configuration using the offset LOCOS technique. Further, since the gate electrode and the drain area do not need to be separated as in FIG. 8, the element size can be reduced compared with the technique of document 1.

Moreover, this configuration simply needs to make the impurity concentration of the gate electrode vary in accordance with the positions thereof; no complex processes are needed, and by utilizing a simple manufacturing process, a semiconductor device capable of managing both the suppression of leakage current and the reduction in element size can be realized.

In addition to the above feature, according to another feature of the present invention, there is provided the semiconductor device wherein:

the gate electrode has a concentration gradient in which an impurity concentration becomes lower from the portion located above the channel area towards the electrode edge portions located above the first and second impurity diffusion areas.

In the above case, the concentration gradient may be formed over a length of 0.2 to 0.6 µm towards the electrode edge portions located above the first and the second diffusion areas.

In addition to the above feature, according to another feature of the present invention, there is provided the semiconductor device wherein:

the gate electrode has the impurity concentration of the electrode edge portions located above the first and second impurity diffusion areas that is less than or equal to 0.1 times the impurity concentration of the portion located above the channel area.

According to the above feature, an effect of alleviating the electric field concentration in the gate electrode edge portions can be sufficiently exhibited.

In addition to the above feature, according to another feature of the present invention, there is provided the semiconductor device wherein:

the first impurity diffusion area has a source side drift area of the second conductivity type, and a source area of the second conductivity type formed on the source side drift area and having a higher concentration than that of the source side drift area, the second impurity diffusion area has a drain side drift area of the second conductivity type, and a drain area of the second conductivity type formed on the drain side drift area and having a higher concentration than that of the drain side drift area, and the gate electrode is formed above an area sandwiched between the source area and the drain area so as to overlap at least with a part of the source side drift area and a part of the drain side drift area.

According to the above feature of the present invention, the suppression of the leakage current and the reduction in the element size can both be managed even in a MOS transistor structure forming a drift area.

A method of manufacturing a semiconductor device of the present invention is a method for manufacturing the semiconductor device having the aforesaid first feature, the method including:

forming the well;

forming the gate oxide film on the well and a gate material film on the gate oxide film; and a first ion injection step of transforming the gate material film into the gate electrode and forming the first and second impurity diffusion areas on the well by providing a mask above the gate material film from outer edges of the gate material film over a predetermined width and injecting impurity ions of the second conductivity type and performing annealing in a state in which at least a part of the gate material film located within an area sandwiched by the mask and a surface of the well outside the outer edges are exposed.

According to the above feature of the present invention, since the mask is provided from the outer edges of the gate material film over the predetermined width upon the ion injection, and the impurity ions are not injected into the aforesaid area. On the other hand, in an area located more towards the inner side, where the mask is not provided, the impurity ions are injected into the gate material film. By performing the annealing after having performed the ion injection under the aforesaid ion injection condition, areas (edge portion side areas) of a portion from the outer edges over the predetermined width where the mask had been provided has a lower impurity concentration than that of an area (inner area) on the inner side where the mask had not been provided.

Therefore, the semiconductor device made in accordance with the manufacturing method having the above feature has a configuration having a gate electrode in which the impurity concentration in the edge portion side areas is lower than in the inner area.

Since an area on the substrate located below the inner area becomes a portion functioning as the channel area of the MOS transistor, the impurity concentration of the inner area determines the electrical characteristic of the MOS transistor. On the other hand, compared with the inner area, the impurity concentration of the edge portion side areas does not affect the electrical characteristic of the MOS transistor.

As mentioned above, due to the decrease in the impurity concentration of the edge portion sides of the gate electrode, the depletion in said areas is enhanced, and alleviation of the electric field concentration in said area is thereby enabled. Further, since the semiconductor device manufactured by this method does not require an actual thickening of the gate oxide film or a securing of the offset area, the element size of the semiconductor device can be reduced.

Moreover, compared with the general manufacturing method for a MOS transistor, this method differs only in that a mask is provided in advance over portions of the gate material film (the areas from the outer edges over a predetermined width), and the ion injection is performed under such a state; and no other dedicated process unique to the present invention is required. Hence, while utilizing the conventional processes without a large increase in the number of processes, suppression of the leakage current and reduction of the element size can both be realized.

Note that in the above method, when masking a partial area of the gate material film upon the impurity ion injection, a resist film may be used as said mask, or a CVD oxide film may be used.

In addition to the above feature, according to another feature of the present invention, there is provided the method of manufacturing the semiconductor device of the present invention further comprising:

a second ion injection step of forming a source side drift area and a drain side drift area separately after the well is formed, by injecting impurity ions of the second conductivity type having a lower concentration than in the first ion injection step on predetermined separated areas on the well; and forming the gate oxide film and the gate material film above the source side drift area, the drain side drift area and the channel area being the well area sandwiched between the source side and drain side drift areas, after the second ion injection step is completed, wherein the first ion injection step includes forming a source area within the source side drift area and a drain area within the drain side drift area by injecting impurity ions of the second conductivity type having a higher concentration than in the second ion injection step in a state in which a part of the source side drift area and a part of the drain side drift area are exposed, so that the first impurity diffusion area including the source area and the source side drift area and the second impurity diffusion area including the drain area and the drain side drift area are formed.

According to the above feature, the conventional processes can be used even for the structure of MOS transistor having the drift area without increasing the number of processes, and the suppression of the leakage current and the reduction in the element size can both be realized.

According to the configuration of the semiconductor device of the present invention, in the gate electrode, the impurity concentration at its electrode edge portions is lower than that of an area above the channel area. Therefore, the concentration of the electric field at the electrode edge portions is alleviated, and the occurrence of the leakage current can be prevented.

Furthermore, in the configuration of the present invention, since only the concentration of the impurity doped in the gate electrode is changed in accordance with the electrode positions, unlike the conventional means, the offset area is no longer necessary, and thus the element size can be reduced in comparison with the conventional configuration.

BRIEF DESCRIPTION OF THE DRAWINGS

FIGS. 4A-4C show cross sectional views (2) of the process of manufacturing the semiconductor device of the present invention;

FIGS. 5A-5C show cross sectional views (1) of another process of manufacturing the semiconductor device of the present invention;

DESCRIPTION OF THE PREFERRED EMBODIMENTS

Embodiments of the present invention will be described in detail hereinafter.

Figure 1:
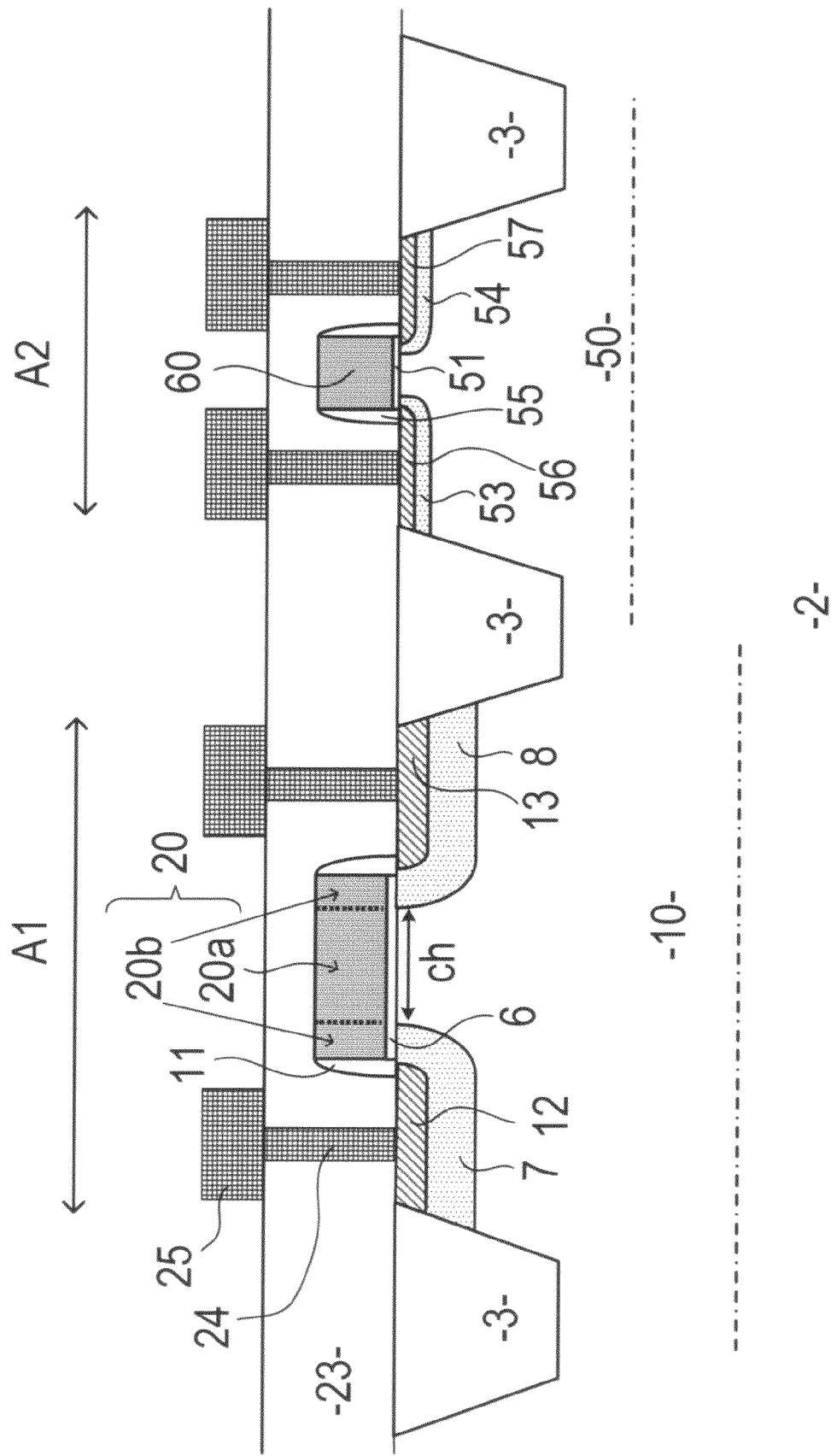
FIG. 1 shows a schematic cross sectional view of a semiconductor device of the present invention.

FIG. 1 shows a part of a schematic cross sectional view of a semiconductor device of the present invention. Note that FIG. 1 has been depicted schematically, and the dimension ratio shown in the drawings may not necessarily match an actual dimension ratio.

The semiconductor device of the present invention as shown in FIG. 1 is configured by having a high breakdown voltage MOS transistor in an area A1 and a low breakdown voltage MOS transistor in an area A2 on a substrate 2. The high breakdown voltage MOS transistor is formed on a well 10, and provided with a drain area 12, a drain side drift area 7, a source area 13, a source side drift area 8, a gate oxide film 6 and a gate electrode 20.

The low breakdown voltage MOS transistor is formed on a well 50, and provided with a drain area 56, a drain side LDD area 53, a source area 57, a source side LDD area 54, a gate oxide film 51 and a gate electrode 60.

Note that, in the present embodiment, both of the MOS transistors are explained as being an N channel type; however, the same configuration can be realized in a P channel type as will be described later.

Description regarding the high breakdown voltage MOS transistor (area A1) shown in FIG. 1 will be given.

The high breakdown voltage MOS transistor has a p-type well 10 formed within an area separated by an element separating insulation film 3 on the substrate 2. Furthermore, on this well 10, the drift areas 7, 8 (the drain side drift area 7 and the source side drift area 8) that are N type low concentration impurity diffusion areas are formed separately. Note that, in a case where a P type semiconductor substrate is used as the substrate 2, the well 10 can be served by the substrate 2.

On the drain side drift area 7, the drain area 12 that is an N type impurity diffusion area with a higher concentration is formed. Similarly, on the source side drift area 8, the source area 13 that is an N type impurity diffusion area with a higher concentration is formed.

Over a portion of both the drift areas 7, 8, and an area sandwiched by these drift areas (a channel area ch in the figure), the gate electrode 20 is formed via the gate oxide film 6. Moreover, on a side surface of the gate electrode 20, a side wall insulation film 11 is formed.

Further, an interlayer insulation film 23 is formed so as to cover an active area of the substrate 2 and an upper surface of the gate electrode 20, and a wiring layer 25 is formed as an upper layer thereof. The wiring layer 25 is electrically connected to the drain area 12 and the source area 13 via a contact plug 24 independently.

The gate electrode 20 is doped with an N type, and is made e.g., with polysilicon. Further, the gate electrode 20 differs in the impurity concentration at a portion 20a located above the channel area ch and at portions 20b located above a part of the drift area 7 and a part of the drift area 8. If the portion of the gate electrode located above the channel area ch (inside) is referred to as "partial electrode 20a", and the portions of the gate electrode located at the outer side and above the drift areas 7, 8 (edge side) are referred to as "partial electrode 20b", the partial electrodes 20b are configured with lower impurity concentration than the partial electrode 20a.

Especially this partial electrodes 20b have a configuration that has a concentration gradient that becomes lower towards the electrode edges (the drain area 12 side and the source area 13 side).

On the other hand, in the low breakdown voltage MOS transistor, the variation in the impurity concentration according to the locations in the gate electrode 60 is not formed, as in the case with the high breakdown voltage MOS transistor. That is, the low breakdown voltage MOS transistor shown in FIG. 1 has the same configuration as the conventional MOS transistor, so an explanation thereof is abbreviated. Note that, in the figures, 50 is the P type well, 53 is the drain side LDD area, 54 is the source side LDD area, 56 is the drain area, 57 is the source area, 51 is the gate oxide film, 60 is the gate electrode, and 55 is a side wall insulation film.

As in the high breakdown voltage MOS transistor shown in FIG. 1, by varying the impurity concentration according to the locations in the gate electrode 20, and especially, setting the partial electrodes 20b located at the edge sides to be lower in concentration than in the partial electrode 20a located at the inside thereof, the depletion of the gate electrode within the partial electrode 20b upon applying a voltage can be actively made to occur. Due to this, apparently the same effect as in the case of thickening the gate oxide film 6 locally at the aforesaid area can be achieved; and the concentration of electric field within said area can be alleviated.

Further, in the partial electrode 20b, especially regarding the edge portions of the gate electrode (on the drain area 12 and the source area 13 sides), by setting a sufficiently low concentration than the partial electrode 20a at the inside, the effect of preventing the concentration of high electric field at the edge portions of the gate electrode 20 can be enhanced.

Here, at the portion located above the channel area, where an electric characteristic of the MOS transistor is to be determined, i.e., at the partial electrode 20a located on the inside, the impurity concentration corresponding to the desired electric characteristic can be set. Hence, no influence is imposed on the electric characteristic itself of the MOS transistor.

Figure 2:
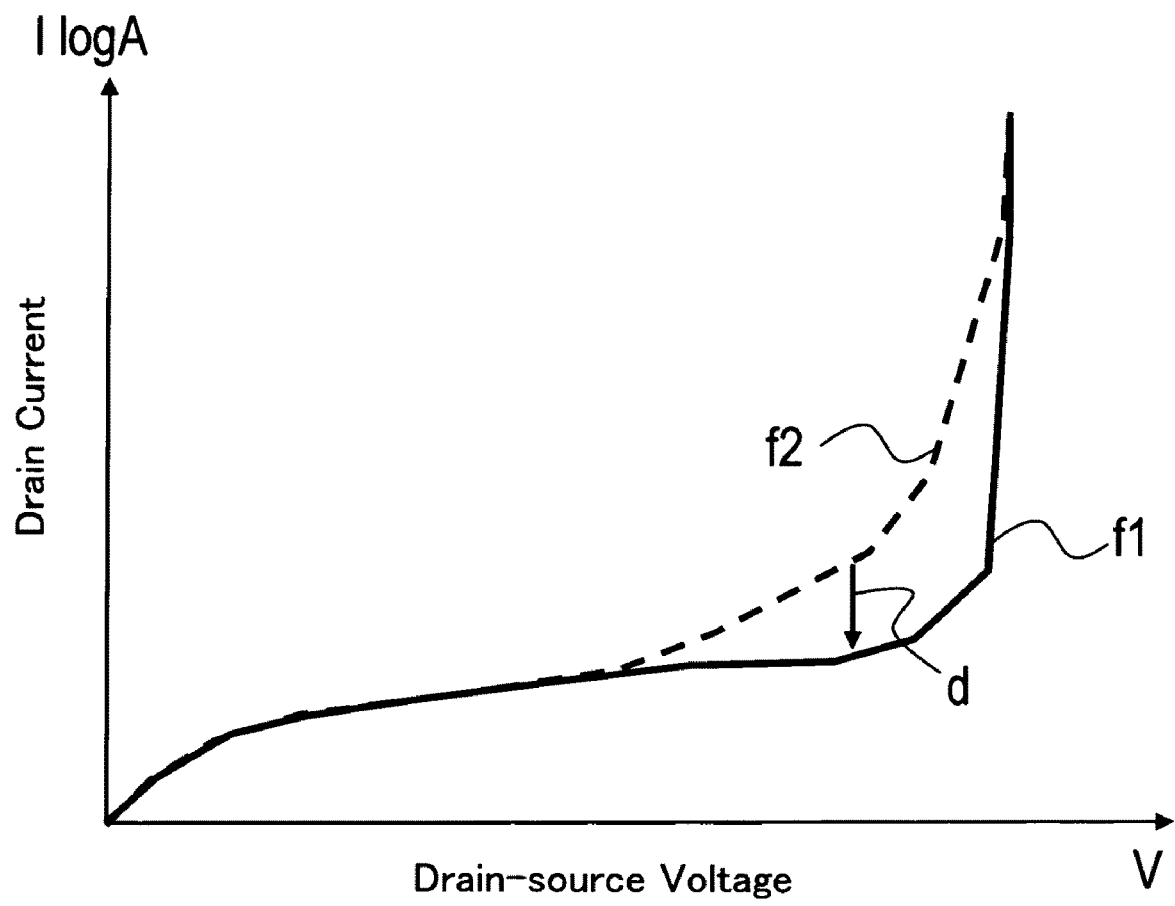
FIG. 2 shows a graph describing an effect of the semiconductor device of the present invention.

FIG. 2 shows a comparison of off breakdown voltage characteristics of the conventional high breakdown voltage MOS transistor (broken line f2) and the high breakdown voltage MOS transistor included in the semiconductor device of the present invention (solid line f1), depicting a relationship when a drain-source voltage is taken as the horizontal axis and a drain current (indicated with logarithms) is taken as the vertical axis.

According to FIG. 2, it can be recognized that the configuration of the present invention reduces the amount of the leakage current than the conventional configuration (see d within FIG. 2). This indicates that the electric field concentration is becoming less likely to be generated between the gate electrode edge portion and the drain area.

Figure 8:
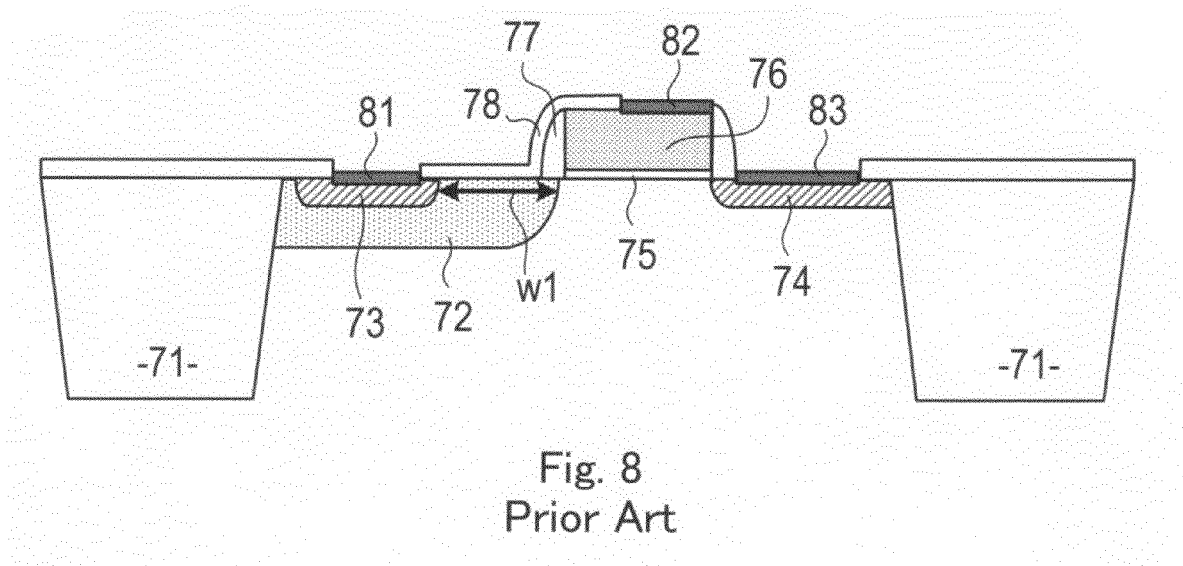
FIG. 8 shows a schematic cross sectional view of a conventional high breakdown voltage MOS transistor.

Furthermore, since the present invention does not actually thicken the gate oxide film like the offset LOCOS, an enlargement in the occupying space of the element as a whole does not take place. Further, since the impurity concentration of the gate electrode is simply varied according to the locations therein, the offset area as in the conventional technique shown in FIG. 8 does not need to be secured; and the reduction in the element size can be obtained even in comparison with the configuration of FIG. 8.

Note that, in the configuration of the present embodiment, the drain side drift area 7 and the drain area 12 correspond to the "first impurity diffusion area" and the source side drift area 8 and the source area 13 correspond to the "second impurity diffusion area". That is, according to this configuration, the gate electrode 20 has the impurity concentration of the electrode edges located above the first and the second impurity diffusion areas in lower concentration than the impurity concentration of the portion located above the channel area ch.

A method of manufacturing the semiconductor device of the present invention will be hereinafter described with reference to cross sectional views of processes: FIGS. 3A to 3C and FIGS. 4A to 4C. Note that, as has been shown in FIG. 1, the case in which the low breakdown voltage MOS transistor is formed in a periphery of the high breakdown voltage MOS transistor will be described.

First, in order to define the forming area A1 for the high breakdown voltage MOS transistor and the forming area A2 for the low breakdown voltage MOS transistor, the element separating insulation film 3 is formed on the substrate at a depth of 0.3 to 0.8 µm using a known technique (STI method, LOCOS method). Note that, the material for the aforesaid substrate is not particularly limited as long as it is suitable for forming the high breakdown voltage MOS transistor; a semiconductor substrate configured by an element semiconductor or a compound semiconductor, or a substrate in which polycrystalline silicon or amorphous silicon is deposited on a glass substrate may be used.

Next, a pad oxide film is formed on the active area defined by the element separating insulation film 3, and the P type well areas 10, 50 are formed by using a known ion injection technique and annealing technique. Note that, as aforesaid, in using the P type substrate as the substrate, the well can be served by the substrate so that the process of forming the well area is unnecessary.

Then, the gate oxide film 6 is formed at a thickness of 30 to 60 nm under an oxygen atmosphere (e.g., oxygen, nitrogen-containing oxygen, halogen added oxygen (HCl or DCE: dichloroethylene)) at 800 to 1000° C.

Figure 3A:
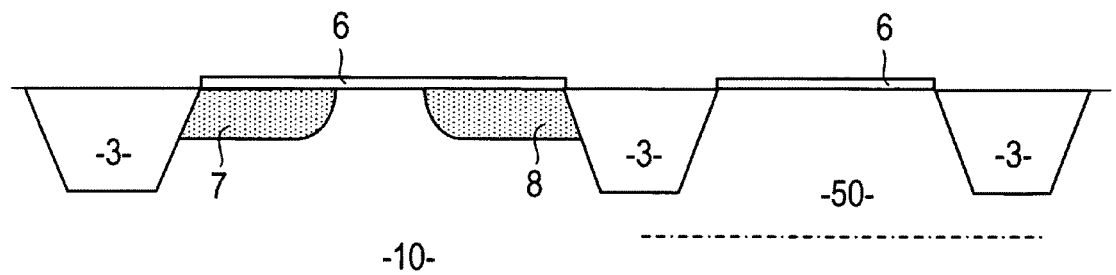
FIGS. 3A-3C show cross sectional views (1) of a process of manufacturing the semiconductor device of the present invention.
Figure 3B:
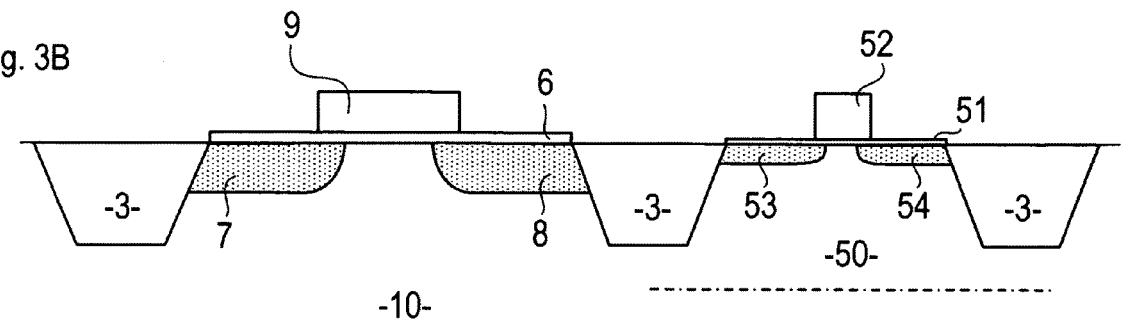

Then, in a predetermined area on the well 10, e.g., a phosphorus (P) ion injection of 80 to 150 keV, $3\times10^{12}$ to $1.2\times10^{13}$ (ions/cm$^2$) is performed so as to form the N type drift areas 7, 8 (see FIG. 3A). Note that the drift areas 7, 8 are formed with a predetermined separation.

Next, the oxide film 6 within the forming area A2 for the low breakdown voltage MOS transistor is removed, and a thinner gate oxide film 51 for use in the low breakdown voltage is again deposited (thickness of 3 to 8 nm).

Next, after having deposited the material film for the gate electrode (e.g., polysilicon and amorphous silicon) over an entire surface at 150 to 350 nm, a patterning processing is performed to form the gate material film 9 and the gate material film 52. Thereafter, by a conventionally known technique, the LDD areas 53, 54 for the low breakdown voltage transistor are formed (see FIG. 3B). In this process, the patterning is performed such that the gate material film 9 extends over a portion of the drift area 7, a portion of the drift area 8 and the separation portion of the said drift areas.

Figure 3C:
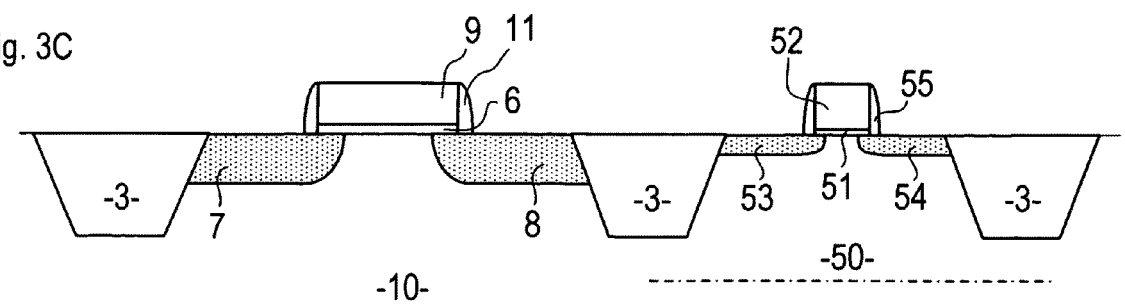

Then, by a conventionally known technique, the side wall insulation film 11 on the side surface of the gate material film 9 and the side wall insulation film 55 on the side surface of the gate material film 52 are respectively formed (see FIG. 3C).

Then, a portion at the outer side above the channel area ch within the gate material film 9 in the area A1 being masked with the resist 30, a phosphorus (P) ion injection of 30 to 60 keV, $5\times10^{15}$ to $2\times10^{16}$ (ions/cm$^2$) is performed (this ion injection step is hereinafter referred to as "step S1"). By step S1, with respect to the drift areas 7, 8, the portion of the gate material film 9 above the channel area ch that is not masked and the LDD areas 53, 54, the impurity ion with a higher concentration than at the time of forming the drift areas 7, 8 or the LDD areas 53, 54 is injected (FIG. 4A).

Then, an annealing processing under a temperature of about 800 to 900° C. for about 10 to 20 minutes in a heat diffusing furnace is performed, or a high speed annealing processing is performed under a temperature of 900 to 1050° C. for about 10 to 60 seconds, so as to activate the impurities.

Due to the above, the drain area 12 in the drain side drift area 7 and the source area 13 in the source side drift area 8 are formed, and the drain area 56, the source area 57 are formed in the LDD areas 53, 54 respectively. Further, the impurity ions injected in the gate material films 9, 52 are also activated, and transform into N type doped gate electrodes 20, 60 respectively (FIG. 4B).

Here, as has been shown in FIG. 4A, at the time of performing step S1, the gate material film 9 is exposed only at above the channel area ch, and the locations on the outer side thereof and above the drift areas 7, 8 is masked with the resist 30. That is, in the gate material film 9, the impurity ions are directly injected only at above the channel area ch, and the ion injection is not performed on the locations above the drift areas 7, 8 on the outer side thereof. Therefore, compared to above the channel area ch where the mask had not been provided, the masked area on the outer side greatly decreases in its impurity concentration after the annealing processing.

As a result of this, the gate electrode 20 is configured to include the partial electrode 20a located above the channel area ch and having high impurity concentration, and the partial electrodes 20b located on the outer side thereof and having low impurity concentration. Further, these partial electrodes 20b lower their impurity concentration towards their edge portions on the sides where the drain area 12 and the source area 13 are formed, because of being farther away from the portion where the direct ion injection had been performed. That is, over the areas where the mask had been provided (in the present embodiment, for over about 0.2 to 0.6 µm towards both sides), the concentration gradient in which the impurity concentration lowers towards the gate electrode edge portions is materialized.

Thereafter, the interlayer insulation film 23 is formed with the CVD method or the like, and the contact plug 24 and the wiring layer 25 are formed by a known technique (see FIG. 4C). The configuration of FIG. 1 is hereby formed.

The high breakdown voltage MOS transistor of the semiconductor device thus formed accordingly has the impurity concentration of the edge portion of the gate electrode 20 on the drain side (as well as the source side) lowered than above the channel area ch, so that the concentration of the high electric field in said edge portion is alleviated, and the leakage current can be suppressed.

Moreover, as mentioned above, the semiconductor device of the present invention can achieve the aforesaid effect by simply taking a beforehand measure of masking a portion of the material film for the gate electrode with the resist upon the ion injection for forming the drain area and the source area (step S1). That is, while utilizing already known processes and without a large increase in the number of processes, both the suppression of the leakage current and the reduction of the element size can be achieved.

Note that, by setting the mask width of the resist 30 for step S1 so that the impurity concentration at the edge portions of the gate electrode 20 becomes equal to or less than 0.1 times the impurity concentration of the partial electrode above the channel area ch, the effect of alleviating the concentration of electric field at the edge portions of the gate electrode 20 can further be enhanced.

Moreover, in the above embodiment, the resist 30 is used as the mask for step S1, however, an oxide film may be used as the mask in performing the ion injection process corresponding to step S1. This case will be hereinafter explained with reference to FIGS. 5 and 6.

Processes until FIG. 3A are identical to the above embodiment. Thereafter, the material film (polysilicon or the like) that serves as the material for the gate electrode is deposited over the entire surface for about 150 to 350 nm, and the CVD oxide film is likewise deposited over the entire surface for about 50 to 150 nm, and then the patterning processing is performed. Due to this, the gate material film 9 and the CVD oxide film 32 thereon are hereby formed within the area A1, and the gate material film 52 and the CVD oxide film 62 thereon are formed within the area A2. Then, by a well known technique, the LDD areas 53, 54 are formed (see FIG. 5A).

Then, by a well known technique, the side wall insulation film 11 is formed on the side surfaces of the layered portion of the gate material film 9 and the CVD oxide film 32, and the side wall insulation film 55 is formed on the side surfaces of the layered portion of the gate material film 52 and the CVD oxide film 62 (see FIG. 5B).

Then, in a state in which the outer portion of the CVD oxide film 32 above the channel area ch is masked by resist 35, the CVD oxide film 32 and the CVD oxide film 62 are removed by etching. Due to this, an upper area 34 of the channel area ch within the area A1 opens, and an upper surface of the gate material film 9 is exposed within said area (see FIG. 5C).

Figure 6A:
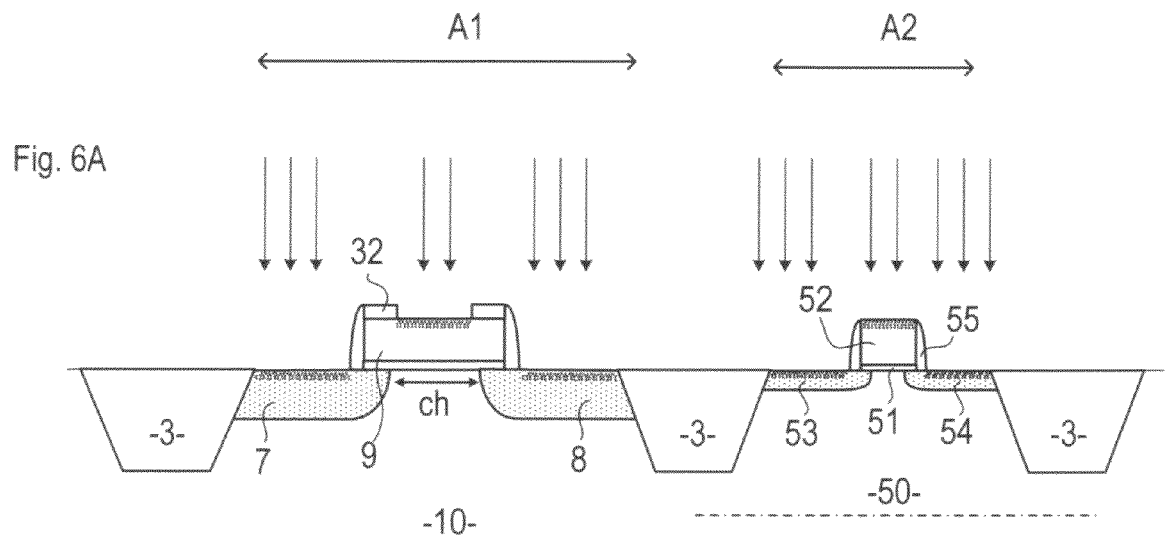
FIGS. 6A-6B show cross sectional views (2) of the other process of manufacturing the semiconductor device of the present invention.
Figure 6B:
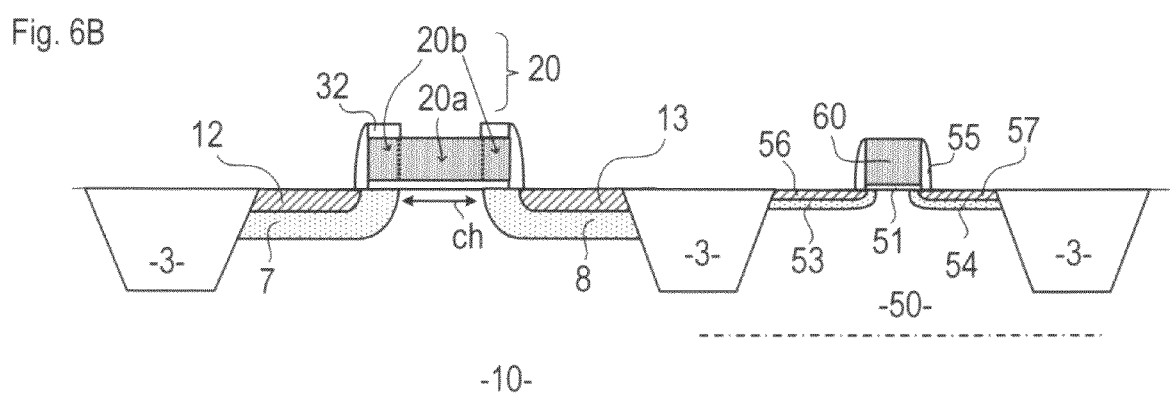

Then, the resist 35 is removed, and the ion injection as in step S1 shown in FIG. 4A is performed (see FIG. 6A). Here, since the CVD oxide film 32 had not been removed and remaining on the outer side above the channel area ch in FIG. 5C, this oxide film serves as the mask so that the impurity ions are not directly injected in to said area. That is, compared with FIG. 4A, a difference lies only in that the mask is the resist 30 or the CVD oxide film 32; but the effect thereof is the same.

Note that, in the case of using the CVD oxide film 32 in place of the resist 30, the pattern of the resist 35 that determines the area where the impurity ions are not injected into the gate material film 9 does not need to be fined. This has a merit of easing the accuracy of alignment with the gate material film 9 (on the edge side).

Thereafter, the annealing process that is the same as that shown in FIG. 4B is performed. Due to this, the gate material film 9 transforms into the gate electrode 20 that has lower impurity concentration towards the edge portions. Further, the gate material film 52 transforms into the gate electrode 60. Processes thereafter are identical to the aforesaid embodiment.

Figure 7:
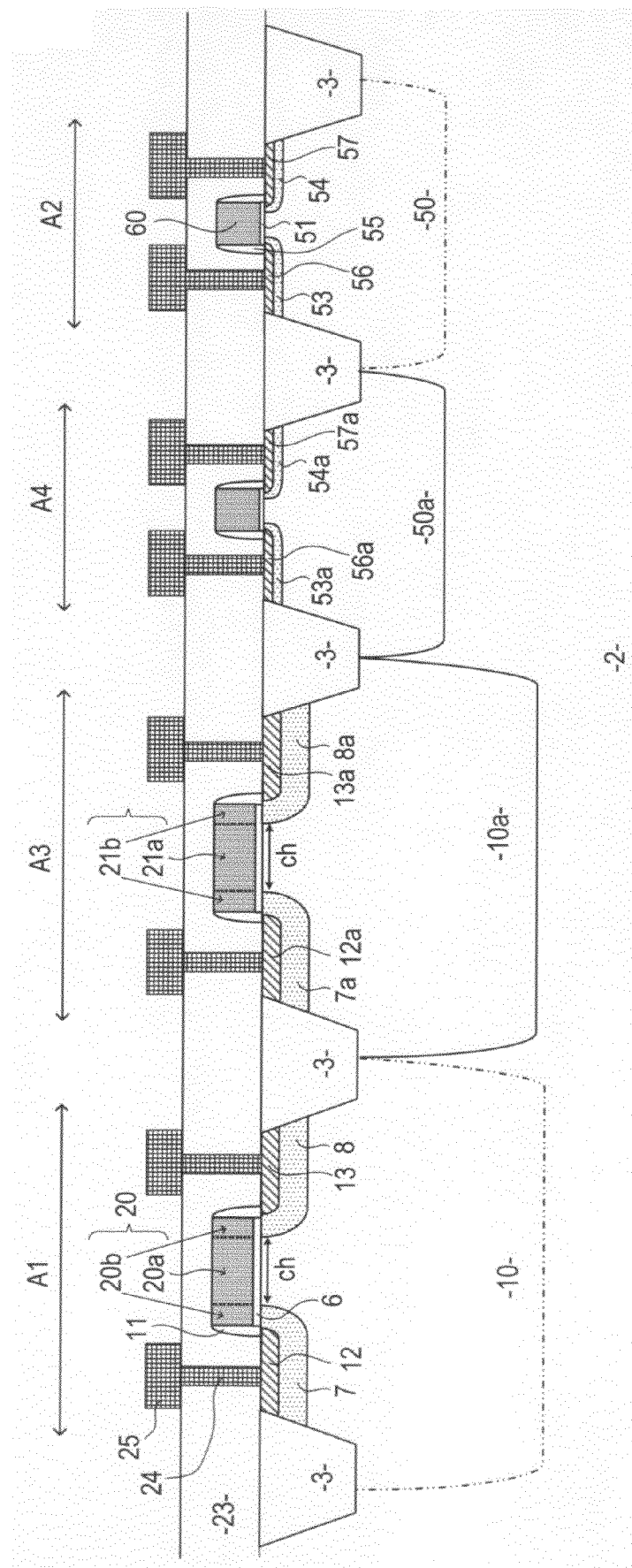
FIG. 7 shows another schematic cross sectional view of the semiconductor device of the present invention.

Other Embodiments (1) In the above embodiments, the case of forming the N channel type high breakdown voltage MOS transistor and the N channel type low breakdown voltage MOS transistor on the substrate has been explained. However, by changing the conductivity type of the impurity ions to be injected, cases of P channel type can also be realized. Moreover, in an application of the above, a semiconductor device consolidating both the P channel type and the N channel type may also be realized. FIG. 7 depicts a configuration of the case in which the high breakdown voltage MOS transistor and the low breakdown voltage MOS transistor are provided in both the P channel type and the N channel type. In areas A1, A2, A3 and A4, MOS transistors of the N type high breakdown voltage, the N type low breakdown voltage, the P type high breakdown voltage and the P type low breakdown voltage are formed respectively. In FIG. 7, a case in which the P type MOS transistors (the high breakdown voltage and the low breakdown voltage) are sandwiched by the N type MOS transistors (the high breakdown voltage and the low breakdown voltage) is depicted.

In FIG. 7, a gate electrode 21 that configures the high breakdown voltage P channel type MOS transistor differs in its impurity concentration at a location above a channel area (21a) and edge portions (21b) located above the drift areas on an outer side thereof, and 21a is configured with higher concentration than 21b. In FIG. 7, respects other than the above differ only in the conductivity type, thus explanations thereof will be abbreviated.

Note that, in the drawings, 10a and 50a show the N wells, 7a, 8a, 53a and 54a show the P type low concentration impurity diffusion areas, and 12a, 13a, 56a and 57a show the P type high concentration impurity diffusion areas.

(2) In the above embodiments, the high breakdown voltage MOS transistor is configured to have low concentrated drift area and high concentrated drain (source) area, however, the drift area can be omitted as needed in accordance with other desired electric characteristics such as the breakdown voltage. In this case, the gate electrode has different impurity concentration at the portion located above the channel area and the portions located on the drain area and source area sides (on the outer side) of aforesaid portion (i.e., above a part of the drain area and above a part of the source area), and the configuration thereof is that the latter has lower impurity concentration than the former. In this case, the drain area and the source area correspond to the first and the second impurity diffusion areas.

Note that, in order to realize such a configuration, the process of forming the drift area can simply be omitted from the processes explained in the above embodiments.

(3) The manufacturing method as stated above is merely an example, and other methods may be employed so long as the configuration where the impurity concentration of the gate electrode at the edge portions is lower than that at the location above the channel area can be realized.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A method of manufacturing a semiconductor device, the semiconductor device including
   a well of a first conductivity type formed on a substrate;
   a first impurity diffusion area and a second impurity diffusion area formed on the well, separated from each other by a channel area and of a second conductivity type different from the first conductivity type; and
   a gate electrode formed, via a gate oxide film, above a part of the first impurity diffusion area, above the channel area and above a part of the second impurity diffusion area, wherein
   the gate electrode is doped with the second impurity type, and
   an impurity concentration of electrode edge portions located above the first and second impurity diffusion areas is lower than an impurity concentration of a portion located above the channel area,
   the method of manufacturing the semiconductor device comprising:
   forming the well;
   forming the gate oxide film on the well and a gate material film on the gate oxide film; and
   a first ion injection step of transforming the gate material film into the gate electrode and forming the first and second impurity diffusion areas on the well by providing a mask above the gate material film from outer edges of the gate material film over a predetermined width and injecting impurity ions of the second conductivity type and performing annealing in a state in which at least a part of the gate material film located within an area sandwiched by the mask and a surface of the well outside the outer edges are exposed.

2. The method of manufacturing the semiconductor device according to claim 1, the method further comprising:
   a second ion injection step of forming a source side drift area and a drain side drift area separately after the well is formed, by injecting impurity ions of the second conductivity type having a lower concentration than in the first ion injection step on predetermined separated areas on the well; and
   forming the gate oxide film and the gate material film above the source side drift area, the drain side drift area and the channel area being the well area sandwiched between the source side and drain side drift areas, after the second ion injection step is completed, wherein
   the first ion injection step includes forming a source area within the source side drift area and a drain area within the drain side drift area by injecting impurity ions of the second conductivity type having a higher concentration than in the second ion injection step in a state in which a part of the source side drift area and a part of the drain side drift area are exposed, so that the first impurity diffusion area including the source area and the source side drift area and the second impurity diffusion area including the drain area and the drain side drift area are formed.

* * * * *